United States Patent
Koehler et al.

(10) Patent No.: US 9,704,773 B2
(45) Date of Patent: Jul. 11, 2017

(54) SYSTEM AND METHOD FOR A SWITCHABLE HEAT SINK

(75) Inventors: Frederick B. Koehler, Tucson, AZ (US); Douglas M. Beard, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 1027 days.

(21) Appl. No.: 13/301,617

(22) Filed: Nov. 21, 2011

(65) Prior Publication Data
US 2013/0126148 A1 May 23, 2013

(51) Int. Cl.
*F28F 27/00* (2006.01)
*H01L 23/36* (2006.01)
*F28F 13/00* (2006.01)

(52) U.S. Cl.
CPC ........ *H01L 23/36* (2013.01); *F28F 2013/008* (2013.01); *H01L 2924/0002* (2013.01)

(58) Field of Classification Search
CPC ............... H01L 23/36; H01L 2924/00; H01L 2924/0002; F28F 2013/008
USPC ............. 165/277, 185, 96, 275, 276; 62/383
See application file for complete search history.

(56) References Cited

U.S. PATENT DOCUMENTS

| | | | | |
|---|---|---|---|---|
| 4,281,708 A | * | 8/1981 | Wing et al. | 165/277 |
| 4,388,965 A | * | 6/1983 | Cunningham et al. | 165/277 |
| 4,770,004 A | * | 9/1988 | Lagodmos | 62/383 |
| 5,005,639 A | * | 4/1991 | Leland | 165/104.25 |
| 5,135,048 A | * | 8/1992 | Behrle et al. | 165/96 |
| 5,379,601 A | * | 1/1995 | Gillett | 62/383 |
| 6,404,636 B1 | * | 6/2002 | Staggers et al. | 165/185 |
| 7,154,369 B2 | * | 12/2006 | Dietz et al. | 165/276 |
| 7,295,435 B2 | | 11/2007 | Ouyang | |
| 7,621,319 B2 | | 11/2009 | Ouyang | |
| 2010/0065263 A1 | * | 3/2010 | Tanchon et al. | 165/185 |

FOREIGN PATENT DOCUMENTS

WO   WO 2008020668 A1 * 2/2008

* cited by examiner

*Primary Examiner* — Travis Ruby

(57) ABSTRACT

A method and system for selectively dissipating thermal energy are provided. The system includes a heat-generating structure, a first heat sink, a second heat sink, and a heat transfer element. The heat-generating structure generates thermal energy. The first heat sink is in thermal communication with the heat-generating structure. The heat transfer element is configured to be selectively positioned between the first heat sink and the second heat sink to establish a path for the transfer of thermal energy between the first heat sink and the second heat sink. Upon positioning the heat transfer element between the first heat sink and the second heat sink, at least a portion of the thermal energy from the heat-generating structure is allowed to travel through the first heat sink and through the heat transfer element to the second heat sink.

20 Claims, 4 Drawing Sheets

SYSTEM AND METHOD FOR A SWITCHABLE HEAT SINK

TECHNICAL FIELD

The present disclosure is directed, in general, to cooling systems, and more specifically, to a system and method for a switchable heat sink.

BACKGROUND OF THE DISCLOSURE

In a variety of scenarios, a structure that may ordinarily be considered a suitable heat sink may suddenly become an unsuitable heat sink. This may occur as a result of changed conditions in a system. As one example, due to operating conditions, a heat sink may become undesirably hot, effectively removing its ability to serve as a heat sink. Additionally, in certain scenarios, the heat sink may become so hot that it becomes a source of heat or thermal energy as opposed to a sink for thermal energy.

SUMMARY OF THE DISCLOSURE

To address one or more of the above-identified deficiencies of the prior art, one embodiment of the disclosure is a system and method for a switchable heat sink. The system is configured to selectively dissipate thermal energy and includes a heat-generating structure, a first heat sink, a second heat sink, and a heat transfer element. The heat-generating structure generates thermal energy. The first heat sink is in thermal communication with the heat-generating structure. The heat transfer element is configured to be selectively positioned between the first heat sink and the second heat sink to establish a path for the transfer of thermal energy between the first heat sink and the second heat sink. Upon positioning the heat transfer element between the first heat sink and the second heat sink, at least a portion of the thermal energy from the heat-generating structure is allowed to travel through the first heat sink and through the heat transfer element to the second heat sink.

Certain embodiments of the disclosure may provide numerous technical advantages. For example, a technical advantage of one embodiment may include the ability to sink and un-sink a heat sink. Other technical advantages of other embodiments may include the capability to automatically switch a heat sink on and off based on a temperature of the heat sink. Yet other technical advantages of other embodiments may include the capability to switch between different heat sinks, depending on the temperatures of each. Still yet other technical advantages of other embodiments may include the capability to sink and un-sink a heat sink utilizing a fluid containing magnetic particles.

Although specific advantages have been enumerated above, various embodiments may include all, some, or none of the enumerated advantages. Additionally, other technical advantages may become readily apparent to one of ordinary skill in the art after review of the following figures and description.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system, or part thereof that controls at least one operation. A controller represents any suitable structure, such as hardware or a combination of hardware and software/firmware instructions. The functionality associated with any particular controller may be centralized or distributed, whether locally or remotely.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

It should be understood at the outset that, although exemplary embodiments are illustrated below, the present invention may be implemented using any number of techniques, whether currently known or not. The present invention should in no way be limited to the example implementations, drawings, and techniques illustrated below, and no such limitation is intended. Additionally, the drawings are not necessarily drawn to scale.

Figure 1A:
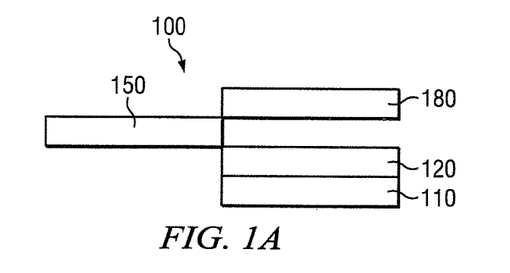
FIGS. 1A and 1B illustrate a switchable heat sink, according to an embodiment of the disclosure.
Figure 1B:
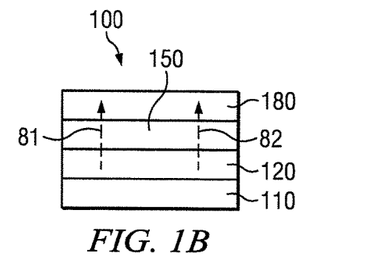

FIGS. 1A and 1B illustrate a switchable heat sink 100, according to an embodiment of the disclosure. The switchable heat sink 100 in the embodiment of FIGS. 1A and 1B includes a heat-generating structure 110, a first heat sink 120, a heat transfer element 150, and a second heat sink 180.

The heat-generating structure 110 may be any device or structure that generates heat or thermal energy. In particular configurations, the heat-generating structure 110 may be electronics or circuits. The heat-generating structure 110 may have an associated first heat sink 120 to which thermal energy is designed to drain.

The heat transfer element 150 may be any material capable of transferring thermal energy, including solids, liquids, and gases. The second heat sink 180 represents any device or item capable of receiving thermal energy. Both the first heat sink 120 and the second heat sink 180 may be made of any suitable material including, but not limited to, metallic materials.

In operation, the heat transfer element 150 is selectively placed into position between the first heat sink 120 and the second heat sink 180 to allow the dissipation of thermal energy as indicated by arrows 81 and 82. For example, if the heat sink 180 has a suitable temperature, the heat transfer element 150 may be positioned between the two. However, if the heat sink 180 does not have a suitable temperature, the heat transfer element 150 may be removed from between the first heat sink 120 and the second heat sink 180. As an example of such suitable temperatures, if the second heat sink 180 has a temperature higher than first heat sink 120 (and absent a thermoelectric cooler), it would be undesirable to place the heat transfer element into position because the first heat sink 120 (and heat-generating structure 110) would not be dissipating thermal energy. Rather, thermal energy may undesirably be supplied to the first heat sink 120 from the second heat sink 180. Accordingly, in particular configurations, the selective positioning of the heat transfer element 150 is dependent on a temperature of the second heat sink 180.

Although a particular configuration of a switchable heat sink is shown in FIG. 1 and particular configurations of switchable heat sinks will be shown and described herein, a variety of other configurations may be utilized, including those with more less or different components.

Figure 2A:
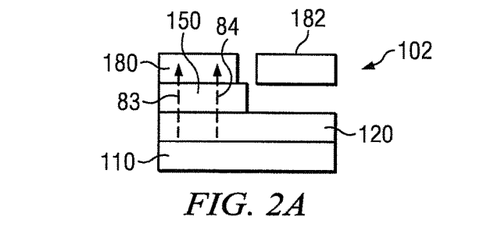
FIGS. 2A and 2B illustrate another switchable heat sink, according to an embodiment of the disclosure.
Figure 2B:
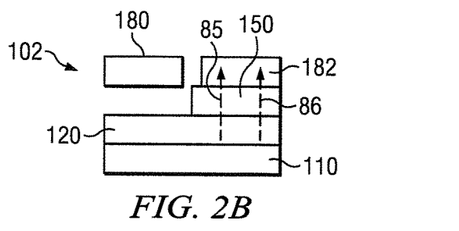

FIGS. 2A and 2B illustrate another switchable heat sink 102, according to an embodiment of the disclosure. The switchable heat sink 102 includes the heat-generating structure 110, the first heat sink 120, the heat transfer element 150, and the second heat sink 180 as shown in FIG. 1. However, the switchable heat sink 110 also includes a third heat sink 182. Similar to the second heat sink 180, the third heat sink 182 represents any device or item capable of receiving thermal energy and may be made of any suitable material.

In particular configurations, it may be desirable to have multiple paths for the dissipation of thermal energy depending on the dynamics of the system, device, or equipment in which the switchable heat sink is contained, including, for example, the respective temperatures of the second heat sink 180 and the third heat sink 182.

As a non-limiting operative example, in space-borne equipment such as space orbiting satellites and other space equipment, there may be a portion of the space-borne equipment exposed to the sun and another portion not exposed. Such exposure to the sun may vary over time. The portion exposed to the sun may have high temperatures and be unsuitable for a heat sink; however, the portions not exposed to the sun may have relatively cool temperatures and be suitable for a heat sink. Thus, the second heat sink 180 may represent a portion of the space-borne equipment whereas the third heat sink 182 may represent another portion of the space borne equipment. Depending on which portion is currently exposed to the sun, the switchable heat sink 102 may selectively move the heat transfer element 150 to dissipate the thermal energy from a heat-generating structure to the heat sink 180 or 182 not exposed to the sun.

In such multiple path scenarios, thermal energy may be dissipated through paths 83 and 84 in certain scenarios and paths 85 and 86 in other scenarios. Although two heat sinks 180, 182 are shown in this configuration, more than two may be utilized in other configurations where the heat transfer element 150 may be moved between any one of three or more paths for the thermal energy.

Figure 3A:
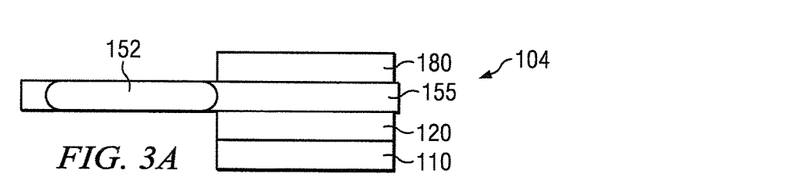
FIGS. 3A and 3B illustrate another switchable heat sink, according to yet another embodiment of the disclosure.
Figure 3B:
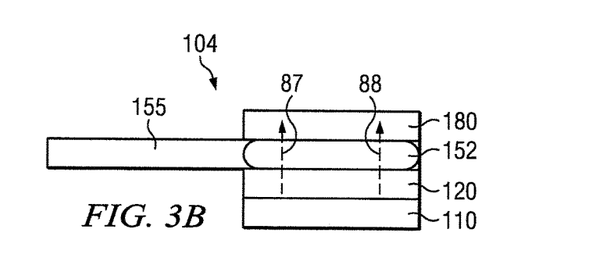

FIGS. 3A and 3B illustrate another switchable heat sink 104, according to yet another embodiment of the disclosure. The switchable heat sink 104 includes the heat-generating structure 110, the first heat sink 120, and the second heat sink 180 as shown in FIG. 1. However, the heat transfer element 152 is thermally conductive fluid that is capable of being moved in a chamber 155. As described with reference to figures below, the thermally conductive fluid for the heat transfer element 152 may be a ferrofluid or colloidal suspension of magnetic particles that move according to a magnetic field applied thereto. In operation, the fluid is moved from one side of the chamber 155 to another to selectively allow dissipation of the thermal energy to the second heat sink 180 in a similar manner as that shown above with reference to FIGS. 1A and 1B to allow thermal energy to move along paths 87, 88.

Figure 4A:
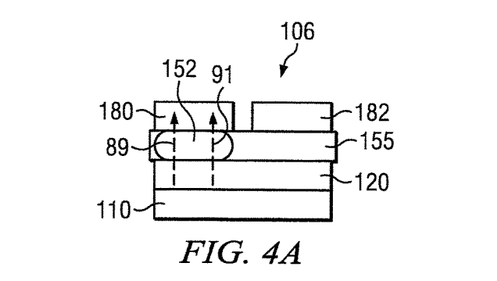
FIGS. 4A and 4B illustrate another switchable heat sink, according to yet another embodiment of the disclosure.
Figure 4B:
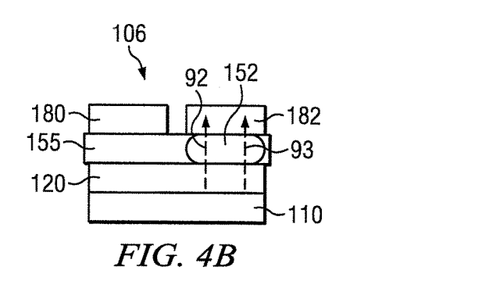

FIGS. 4A and 4B illustrate another switchable heat sink 106, according to yet another embodiment of the disclosure. The switchable heat sink 110 includes the heat-generating structure 110, the first heat sink 120, the second heat sink 180, and the third heat sink 182 as shown in FIGS. 2A and 2B, and the chamber 155 and heat transfer element as shown in FIGS. 3A and 3B. In a manner similar to FIGS. 2A and 2B, the movement of the heating transfer element 152 allows multiple paths for the transfer of thermal energy (e.g., paths 89, 91 or paths 92, 93). Additionally, although two are shown, three or more may be utilized in other configurations.

Figure 5A:
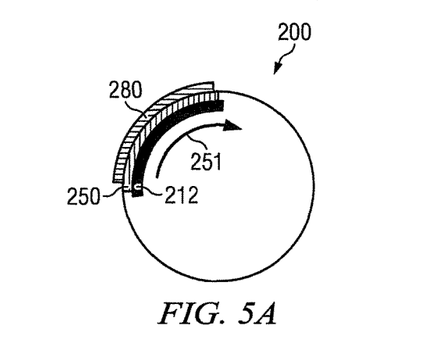
FIGS. 5A and 5B illustrate another switchable heat sink, according to yet another embodiment of the disclosure.
Figure 5B:
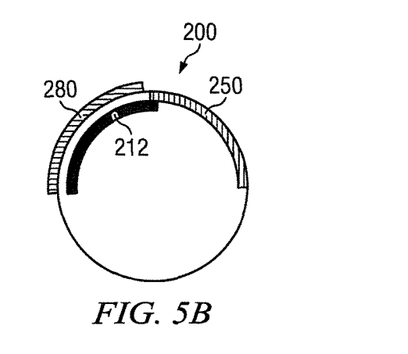

FIGS. 5A and 5B illustrate another switchable heat sink 200, according to yet another embodiment of the disclosure. The switchable heat sink 200 in the embodiment of FIGS. 5A and 5B includes a heat-generating structure and/or first heat sink (collectively item 212), a heat transfer element 250, and a second heat sink 280 similar to that described in FIGS. 1A and 1B. However, the heat transfer element 250 is shown being rotated out of position, for example, as shown by arrow 251. Such a configuration may be utilized by other embodiments of the disclosure.

Figure 6A:
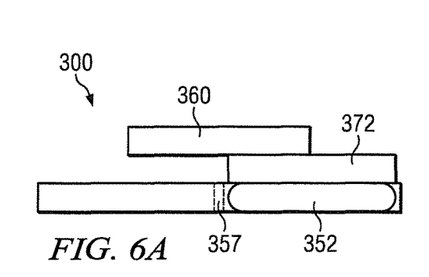
FIGS. 6A and 6B illustrates aspects of a switchable heat sink that may be utilized in embodiments of the disclosure.
Figure 6B:
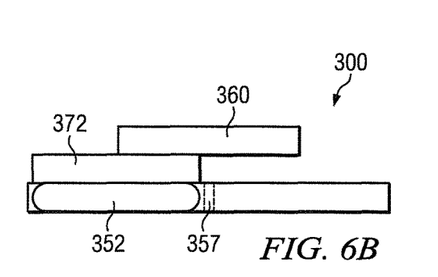

FIGS. 6A and 6B illustrates aspects of a switchable heat sink 300 that may be utilized in embodiments of the disclosure. In FIGS. 6A and 6B, a heat transfer element 352 is shown as a ferrofluid or colloidal suspension of magnetic particles in a movable magnetic field. Because of the magnetic properties of the heat transfer element 352, movement of a magnet 372 will also cause movement of the heat transfer element 352. Accordingly a movement of the magnet 372 to the right as shown in FIG. 6A shows how the heat transfer element 352 moves to the right and the movement of the magnet 372 to the left as shown in FIG. 6B shows how the heat transfer element 372 moves to the left. The remainder of the elements for the switchable heat sink, for example the first heat sink and the second heat sink, and the heat-generating structure are not shown.

An actuator 360 may be any actuator capable of moving the magnet 372 for appropriate positioning of the heat conducting element 352, for example, as shown in FIGS. 1A, 1B, 2A, 2B, 3A, 3B, 4A, and 4B. Non-limiting examples of actuators include, but are not limited to, electrically activated, power screws, pneumatic actuators, compressed fluid actuators, electromagnetic actuators, thermal energy actuators, and bimorph actuators. Yet other types of actuators will become apparent to one or ordinary skill in the art after review of this disclosure. This disclosure is not intended to be limited to any one actuator. Additionally, more than one and more than one type of actuator may be utilized in particular configurations.

Although the heat transfer element 372 is described as being a fluid in this embodiment, the disclosures herein may equally apply to configurations in which the heat transfer element 372 is a solid. In certain configurations, the actuator(s) 360 may act directly on the heat transfer element. In other configurations, the actuator(s) 360 may indirectly act on the heat transfer element.

In particular configurations, the actuator(s) 360 may take advantage of forces and/or energy that result from an operation of the system, device, or equipment in which the switchable heat sink is contained and/or a surrounding environment of the system, device, or equipment. Non-limiting examples include gravity, buoyancy, atmospheric pressure and/or temperature, inertia, the dissipated thermal energy from the heat-generating structure, and/or other parameters of the surrounding environment or combinations of the preceding. As a non-limiting example, in a device traveling at high speeds, forces of air against leading surfaces of the device may be used as an actuator, for example, to move the heat transfer element 352 from a first location to a second location leveraging pressure from such leading surface forces and vice versa. For example, a first valve may open to one side of a chamber for movement in a first direction and a second valve may open on a different side of the chamber for movement in a different direction. Additionally, the very thermal energy that is dissipated from the heat-generating structure may be utilized to develop a pressure in a chamber to move a mechanism from the second location to the first location or vice versa. Additionally, for example, in space-borne equipment, thermal energy from the sun may be harnessed to move a mechanism from a first location to a second location and vice versa.

An element 357 represents any of a variety of devices that may be keep either the heat transfer element 352 and/or magnet 372 in position after particular movement. Non-limiting examples for element 357 include selectively activated latches, valves, magnets, friction locks, and the like. A variety of other elements 357 should become apparent to one or ordinary skill in the art after review of the specification. Such elements 357 in particular configurations may be activated by the actuator(s) 360.

In particular configurations, it may be desirable to only utilize energy during movement of the heat transfer element 352. Accordingly, the actuator 360 may initiate movement of the heat transfer element 352 (e.g., by initiating movement of the magnet 372) and/or the element 357 and once in place, may no longer need to be activated to maintain the heat transfer element 352 in place. The element 357 may, for example, keep the heat transfer element 352 in place. As an example, a permanent magnets may respectively be placed on a solid form heat transfer element and corresponding locations in a chamber for positioning of the solid form heat transfer element. The actuator may overcome the magnetic attraction between the heat transfer element and a magnet at a first location to move the solid form heat transfer element to another location for additional magnetic attraction with a different magnet.

Figure 7A:
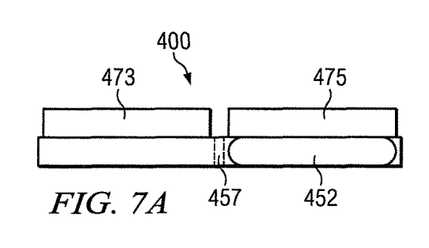
FIGS. 7A and 7B illustrate additional aspects of a switchable heat sink that may be utilized in embodiments of the disclosure.
Figure 7B:
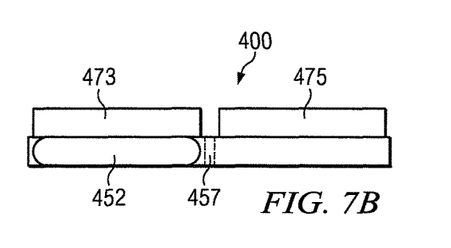

FIGS. 7A and 7B illustrate additional aspects of a switchable heat sink 400 that may be utilized in embodiments of the disclosure. In FIGS. 7A and 7B, the actuators are electromagnets 473, 475 that do not move. Selective activation of one of the electromagnets 473, 475 attracts the heat transfer element 452 to the respective electromagnets. Although generally shown as a block, the electromagnets 473, 475 may have selective portions of the electromagnet charged to facilitate movement.

Similar to that shown above, in particular configurations, an element 457 may be utilized to maintain the heat transfer element 452 in position without maintaining an activation of the electromagnets 473, 475. A non-limiting example is a valve between respective portions of a chamber, for example, in the case where the heat transfer element 452 is a fluid. Element 457 may also include other structure, including those described above with reference to element 357.

Figure 8:
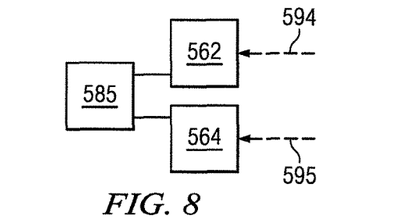
FIG. 8 illustrates how a sensor may be utilized to activate the actuators, according to an embodiment of the disclosure.

FIG. 8 illustrates how a sensor 585 may be utilized to activate the actuators 562, 564, according to an embodiment of the disclosure. In particular configurations, the sensor 585 may be a thermal sensor that measures a temperature of a heat sink and issues a signal to the actuators 562, 564 to begin actuation in the case temperature exceeds a certain threshold condition (e.g., too hot or too cold). In addition to measuring a temperature of the heat sink, the sensor 585 may also measure the temperature of the heat-generating structure or the first heat sink (proximate to the heat-generating structure) and ambient temperature. By doing so, a temperature differential between the respectively measured items may be consulted to determine whether or not there is a suitable temperature differential for signaling the actuators 562, 564 to move the heat transfer element. As a non-limiting example, when the temperature differential between the second heat sink and the first heat sink is small, the heat transfer element may be moved out of position from between the first heat sink and the second heat sink.

In particular configurations, the sensor 585 may have a controller. In other configurations, multiple sensors 585 may be utilized. Additionally, in yet other configurations, the sensor 585 may be integrated into the actuators 562, 564. As referenced above, in particular configurations, energy for actuator 562 and/or 564 may come from the thermal energy dissipated from the heat generating structure as shown by arrows 594, 595.

Figure 9A:
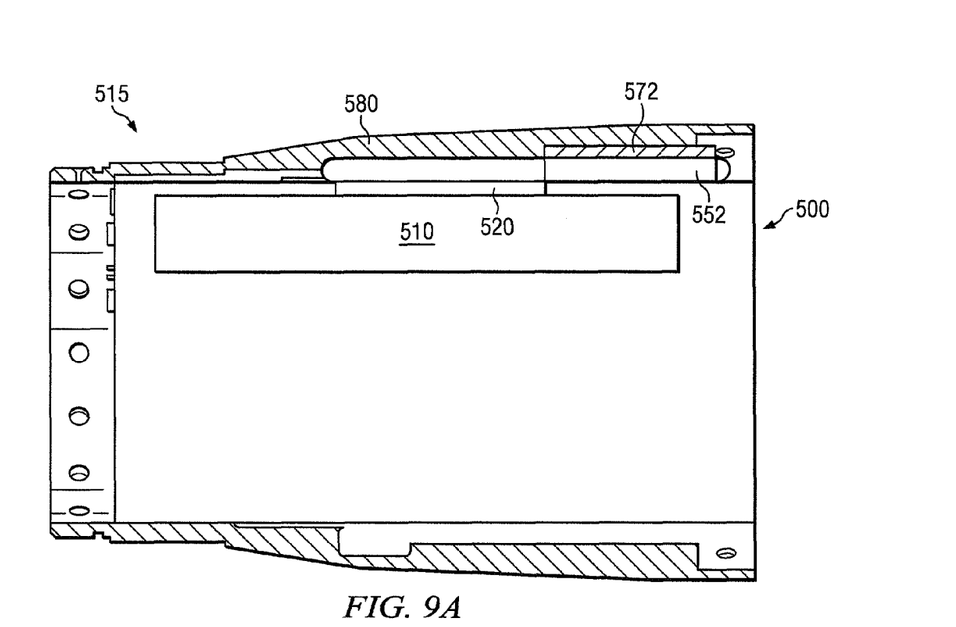
FIGS. 9A and 9B illustrate another switchable heat sink within an environment, according to yet another embodiment of the disclosure.
Figure 9B:
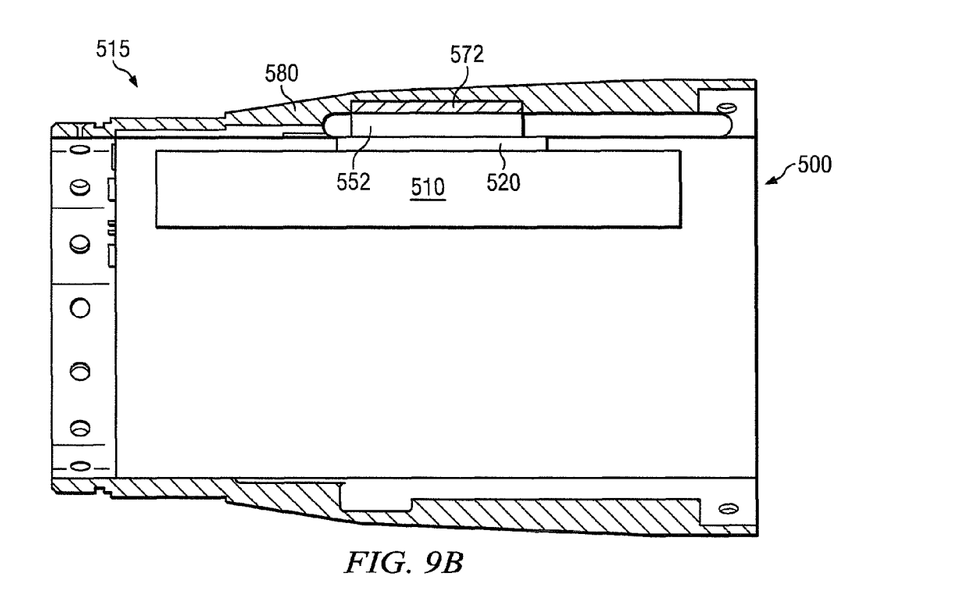

FIGS. 9A and 9B illustrate another switchable heat sink 500 within an environment, according to yet another embodiment of the disclosure. In the embodiment of FIGS. 9A and 9B, the switchable heat sink 500 is shown selectively dissipating thermal energy to a skin of a missile 515. Similar to that shown with reference to FIGS. 3A, 3B, 6A, and 6B, the switchable heat sink 500 includes a heat-generating structure 510, a first heat sink 520, a second heat sink 580, and a heat transfer element 552, and a magnet 572. In this configuration, the second heat sink 580 is the skin of the missile 515 and the heat-generating structure is electronics (e.g., an electronics stack) that may be utilized for operation of the missile 515.

A sensor (not shown) may sense that the skin of the missile 515 is at a suitable temperature and accordingly have the heat transfer element 552 element moved from the off-position shown in FIG. 9A to the on-position in FIG. 9B, allowing thermal energy to be dissipated to the skin of the missile 515. Contrariwise, a sensor may also sense that the skin of the missile 515 is not at a suitable temperature (e.g., the missile is traveling at supersonic speeds) and accordingly have the heat transfer element 552 element moved from the on-position shown in FIG. 9B to the off-position shown in FIG. 9A. In both such movements, the magnet 572 may be moved using any suitable actuator, for example, as described with reference to FIGS. 6A and 6B.

Figure 10:
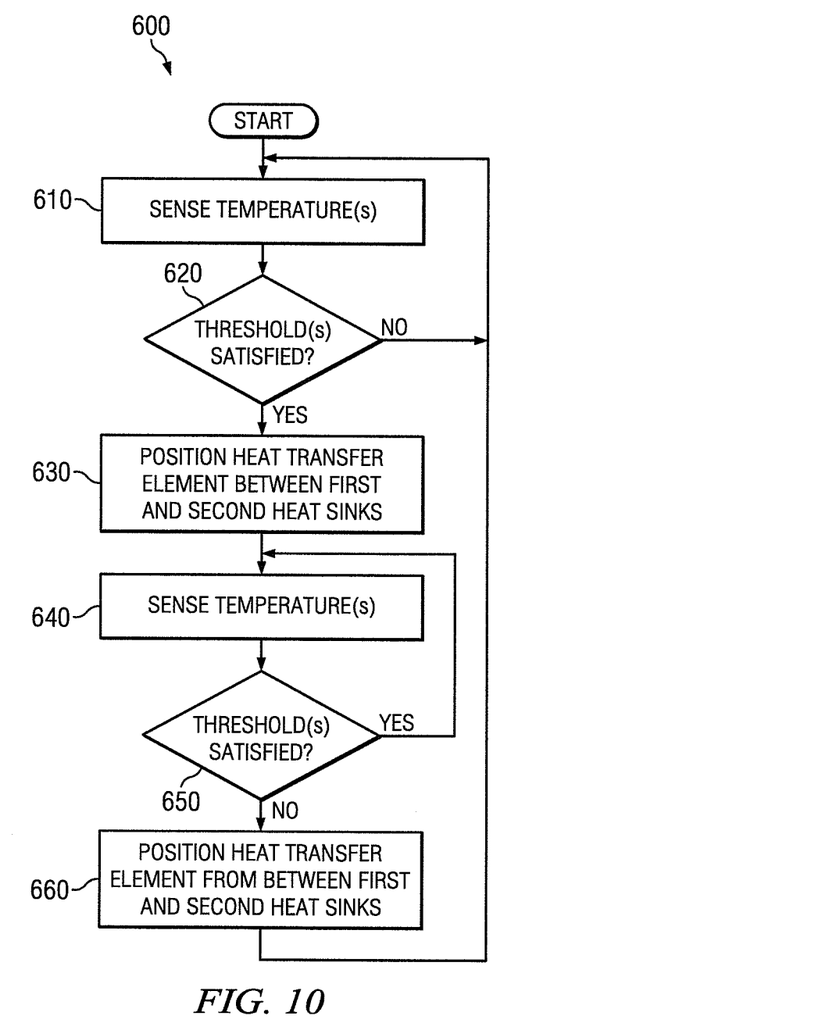
FIG. 10 illustrates a method for dissipating thermal energy, according to an embodiment of the disclosure.

FIG. 10 illustrates a method 600 for dissipating thermal energy, according to an embodiment of the disclosure. Although this method will be described, other methods may be utilized, including those disclosed herein. The method 600 of FIG. 10 includes a sensing of the temperature of the second heat sink at step 610. Additionally, according to certain embodiments, the temperature of the heat-generating structure and/or a first heat sink may also be sensed at step 610. Moreover, in certain embodiments, ambient temperature may also be measured. Then, a determination is made at step 620 as to whether or not threshold(s) are satisfied. In certain embodiments, the threshold may be a temperature. In such embodiments, the threshold may be satisfied when the temperature of the second heat sink is below a value. In other embodiments, the threshold may be a temperature differential. In such embodiments, the threshold may be satisfied when the temperature differential between the second heat sink and the heat-generating structure and/or the first heat sink is greater than a value. Additionally, as referenced above, the threshold may actually be multiple thresholds. For example, in certain embodiments, a first value may need to be satisfied, for example, the ambient temperature may need to be low enough to serve as an ultimate heat sink. Then, a second value, which may be a temperature differential, may need to be satisfied. As another example, there may need to be both a large enough temperature differential between the first heat sink and the second heat sink and a large enough temperature differential between the second heat sink and ambient air. Yet other suitable threshold determinations will become apparent to one of ordinary skill in the art after review of this disclosure.

If the threshold(s) are satisfied, the process 600 moves on to step 630. If not, the process 620 moves back to step 610.

At step 630 the heat transfer element is positioned between the first and second heat sinks to allow a dissipation or transfer of thermal energy therethrough.

At step 640, the temperature of the second heat sink is again measured. Additionally, similar to that described above, according to certain embodiments, the temperature of the heat-generating structure and/or a first heat sink may also be sensed at step 640. Additionally, in certain embodiments, ambient temperature may also be measured. Then, at step 650, a determination is made as to whether or not threshold(s) are satisfied. The threshold determination in step 650 may be the same as the threshold determination in step 610. In other embodiments, the thresholds and any associated values may be different. If the threshold is not satisfied, the process 600 proceeds to step 660 where the heat transfer element is positioned away from between the first and second heat sinks and thermal energy is no longer allowed to dissipated from between the first and second heat sinks. If the threshold value is satisfied, the process 600 moves to step 640.

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A system for selectively dissipating thermal energy from a heat-generating structure, the system comprising:
a first heat sink configured to be placed in thermal communication with the heat-generating structure;
a second heat sink having an external surface exposed to an ambient environment;
a third heat sink disposed in proximity to the second heat sink; and
a heat transfer element housed within a chamber in contact with the first, second, and third heat sinks, the heat transfer element configured to move within the chamber between (i) a first position between the first heat sink and the second heat sink to establish a first path for a transfer of the thermal energy between the first heat sink and the second heat sink and (ii) a second position between the first heat sink and the third heat sink to establish a second path for a transfer of the thermal energy between the first heat sink and the third heat sink;
wherein each heat sink is configured to sink thermal energy,
wherein, upon positioning of the heat transfer element at the first position between the first heat sink and the second heat sink, the heat transfer element is configured to allow at least a portion of the thermal energy from the heat-generating structure to travel from the first heat sink through the heat transfer element to the second heat sink and the second heat sink is configured to transfer at least some of the thermal energy received by the second heat sink to the ambient environment, and
wherein, upon positioning of the heat transfer element at the second position between the first heat sink and the third heat sink, the heat transfer element is configured to allow at least part of the thermal energy from the heat-generating structure to travel from the first heat sink through the heat transfer element to the third heat sink.

2. The system of claim 1, wherein the heat transfer element is a fluid, and the first heat sink is configured to sink heat produced from the heat-generating structure independently of whether the heat transfer element establishes the first path for transfer of the thermal energy to the second heat sink.

3. The system of claim 2, wherein the heat transfer element is a ferrofluid or is a fluid containing a colloidal suspension of magnetic particles.

4. The system of claim 3, wherein the heat transfer element is configured to be moved with one or more magnets.

5. The system of claim 3, wherein the heat transfer element is configured to be moved with one or more electromagnets.

6. The system of claim 1, further comprising:
a sensor configured to measure at least a temperature of the second heat sink,
wherein the system is configured, in response to detecting that a threshold has been satisfied, to automatically position the heat transfer element at the first position between the first heat sink and the second heat sink, the threshold based on at least the temperature of the second heat sink; and
wherein the system is configured, in response to detecting that the threshold has not been satisfied, to automatically position the heat transfer element at a location not at the first position between the first heat sink and the second heat sink.

7. The system of claim 6, wherein the threshold is not satisfied when:
the temperature of the second heat sink is lower than a first value; or
a temperature differential between the second heat sink and the first heat sink is higher than a second value.

8. The system of claim 1, wherein the heat transfer element is configured to be rotated into the first position between the first heat sink and the second heat sink.

9. The system of claim 1, further comprising an actuator configured to move the heat transfer element between the first position and the second position.

10. A method for selectively dissipating thermal energy from a heat-generating structure, the method comprising:
moving a heat transfer element within a chamber between (i) a first position between a first heat sink of a system and a second heat sink of the system to establish a first path for a transfer of the thermal energy between the first heat sink and the second heat sink and (ii) a second position between the first heat sink and a third heat sink of the system to establish a second path for a transfer of the thermal energy between the first heat sink and the third heat sink, wherein each heat sink is configured to sink thermal energy, the first heat sink in thermal communication with the heat-generating structure, the second heat sink having an external surface exposed to an ambient environment, the chamber being in contact with the first, second, and third heat sinks;
when the heat transfer element is positioned at the first position between the first heat sink and the second heat sink, transferring at least a portion of the thermal energy from the heat-generating structure from the first heat sink through the heat transfer element to the second heat sink and transferring at least some of the thermal energy received by the second heat sink to the ambient environment; and
when the heat transfer element is positioned at the second position between the first heat sink and the third heat sink, transferring at least a portion of the thermal energy from the heat-generating structure from the first heat sink through the heat transfer element to the third heat sink.

11. The method of claim 10, wherein the heat transfer element is a fluid.

12. The method of claim 11, wherein the heat transfer element is a ferrofluid or is a fluid containing a colloidal suspension of magnetic particles.

13. The method of claim 12, wherein the heat transfer element is moved with one or more magnets.

14. The method of claim 12, wherein the heat transfer element is moved with one or more electromagnets.

15. The method of claim 10, further comprising:
measuring a temperature of the second heat sink,
upon detecting that a threshold has been satisfied, automatically initiating movement of the heat transfer element to the first position between the first heat sink and the second heat sink, the threshold based on at least the temperature of the second heat sink; and
upon detecting that the threshold has not been satisfied, automatically initiating movement of the heat transfer element to a location not at the first position between the first heat sink and the second heat sink.

16. The method of claim 10, further comprising:
activating an actuator to move the heat transfer element to the first position between the first heat sink and the second heat sink, wherein the heat transfer element maintains its position at the first position between the first heat sink and the second heat sink after a deactivation of the actuator.

17. A system for selectively dissipating thermal energy from a heat-generating structure, the system comprising:
a first heat sink configured to be placed in thermal communication with the heat-generating structure;
a second heat sink having an external surface exposed to an ambient environment;
a third heat sink disposed in proximity to the second heat sink;
a heat transfer element housed within a chamber in contact with the first, second, and third heat sinks, the heat transfer element configured to be moved within the chamber between (i) a first position between the first heat sink and the second heat sink to establish a first path for a transfer of the thermal energy between the first heat sink and the second heat sink and (ii) a second position between the first heat sink and the third heat sink to establish a second path for a transfer of the thermal energy between the first heat sink and the third heat sink,
wherein, upon positioning of the heat transfer element at the first position between the first heat sink and the second heat sink, the heat transfer element is configured to allow at least a portion of the thermal energy from the heat-generating structure to travel from the first heat sink through the heat transfer element to the second heat sink and the second heat sink is configured to transfer at least some of the thermal energy received by the second heat sink to the ambient environment, and
wherein, upon positioning of the heat transfer element at the second position between the first heat sink and the third heat sink, the heat transfer element is configured to allow at least part of the thermal energy from the heat-generating structure to travel from the first heat sink through the heat transfer element to the third heat sink;
an actuator configured to move the heat transfer element to the first position between the first heat sink and the second heat sink, wherein the heat transfer element is configured to maintain its position at the first position between the first heat sink and the second heat sink after a deactivation of the actuator; and
a sensor configured to measure a temperature of the second heat sink;
wherein each heat sink is configured to sink thermal energy,
wherein the system is configured, in response to a determination that the temperature of the second heat sink satisfies a threshold, to automatically position the heat transfer element at the first position between the first heat sink and the second heat sink, and
wherein the system is configured, in response to a determination that the temperature of the second heat sink does not satisfy the threshold, to automatically position the heat transfer element at a location not at the first position between the first heat sink and the second heat sink.

18. The system of claim 17, wherein the heat transfer element is a fluid.

19. The system of claim 18, wherein the heat transfer element is a ferrofluid or is a fluid containing a colloidal suspension of magnetic particles.

20. The system of claim 19, wherein the heat transfer element is moved with one or more electromagnets.

* * * * *